United States Patent [19]

Kabayama

[11] Patent Number: 5,138,116
[45] Date of Patent: Aug. 11, 1992

[54] MOUNTING DEVICE FOR ELECTRONIC COMPONENT

[75] Inventor: Sukehiro Kabayama, Tokyo, Japan

[73] Assignee: Pioneer Electronic Corporation, Tokyo, Japan

[21] Appl. No.: 505,381

[22] Filed: Apr. 6, 1990

[30] Foreign Application Priority Data

Aug. 16, 1989 [JP] Japan .................. 1-95960[U]

[51] Int. Cl.⁵ .............................. H01B 17/38
[52] U.S. Cl. .................. 174/138 G; 174/52.1; 248/500; 248/220.2
[58] Field of Search .......... 174/138 G, 52.1, 58, 174/59, 61, 63; 248/500, 221.3, 221.4, 222.1, 231.8, 220.2, 231.1, 71, 73; 338/317; 350/334; 361/403

[56] References Cited

U.S. PATENT DOCUMENTS

| | | | |
|---|---|---|---|
| 3,917,202 | 11/1975 | Reinwall, Jr. et al. | 174/72 A X |
| 3,931,946 | 1/1976 | Soltysik | 174/72 A X |
| 4,157,856 | 6/1979 | Shevchuk | 174/138 G X |
| 4,861,943 | 8/1989 | Yamark | 174/138 G X |

FOREIGN PATENT DOCUMENTS 2001074 7/1971 Fed. Rep. of Germany ... 248/221.4

Primary Examiner—Leo P. Picard
Assistant Examiner—Hyung S. Sough
Attorney, Agent, or Firm—Sughrue, Mion, Zinn, Macpeak & Seas

[57] ABSTRACT

A mounting device of the present invention is characterized in that at least two holders are used for mounting an electronic component onto a printed circuit board. Each of the holders includes a holder body, a first frame member extending from one end of the holder body at a right angle with the holder body, a second frame member extending from the other end of the holder body parallel to the first frame member, projections provided on the first and second frame members at distances corresponding to a thickness of the electronic component, and engaging claws for engaging the holder with the printed circuit board. Therefore, the mounting device of the present invention can mount the electronic component onto the printed circuit board by using at least two holders independently of the width of the electronic part.

3 Claims, 2 Drawing Sheets

FIG. 3
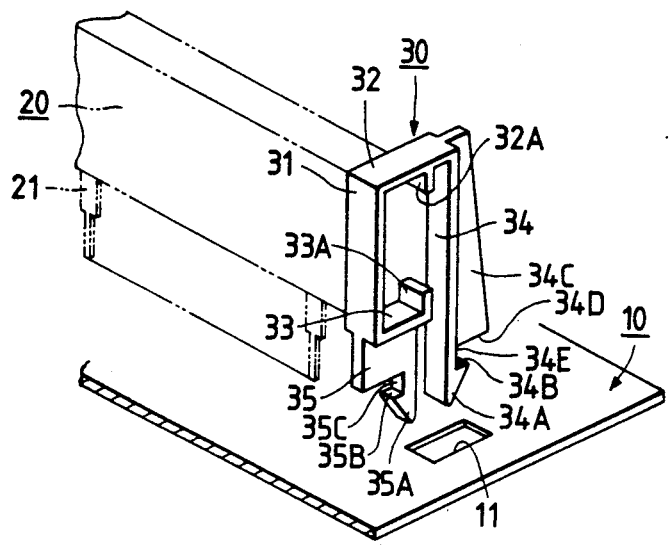
FIG. 5
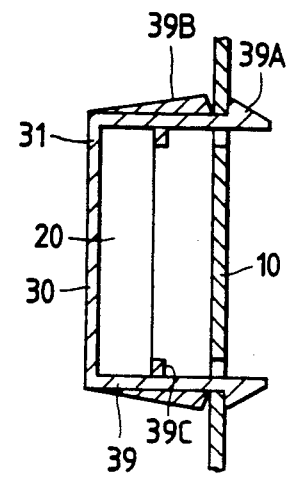
FIG. 4
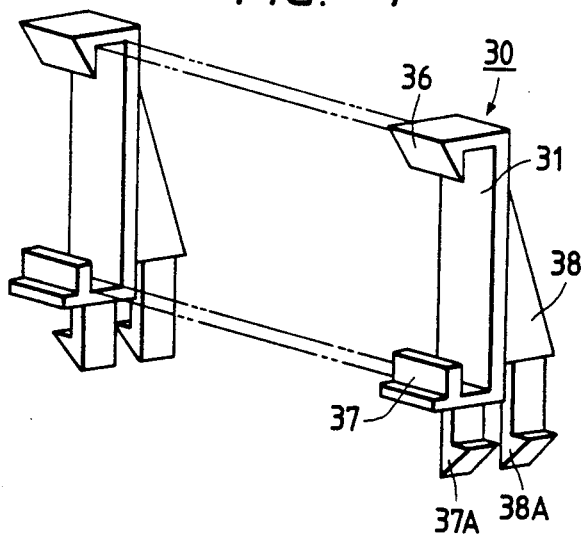
FIG. 6

MOUNTING DEVICE FOR ELECTRONIC COMPONENT

BACKGROUND OF THE INVENTION

This invention relates to a mounting device for an electronic component or the like, and more particularly, to a mounting device for mounting a fluorescent luminescence display, known as FL, on a printed circuit board.

In a conventional art, an electronic part is mounted on a printed circuit board by solder or by using a holder which is different from the electronic part.

In the latter case, as shown in FIG. 1, for example, a FL 1 is held at its outer surface by a holder 2, and the holder 2 is mounted on a printed circuit board 3 through insertion holes 3A, thus mounting the FL 1 on the board.

The holder 2 is provided with a frame 2A to hold the FL 1, and the frame 2A is provided with a plurality of mounting projections 2B, each having an engaging claw 2C at its distal ends. The mounting projections 2B are inserted into the insertion holes 3A and the engaging claws 2C arranged at the distal ends of the mounting projections 2B are engaged with the printed circuit board, so that the holder holding the FL 1 is mounted on the printed circuit board.

A device shown in FIGS. 2(A) and 2(B) is provided with the frame 2A having the mounting projections 2B at its four corners in the same arrangement as the above-described conventional type. In the device shown in FIGS. 2 (A) and (B), each one of the mounting projections 2B has a holding claw 2D to hold the FL 1. The device is provided with holding claws 2E at center portions of the sides of the frame 2. Stops 2F may be provided at both ends of the frame 2 respectively. In addition, a window 2G is formed in front of the frame to expose a display portion of the FL 1.

In the conventional mounting device, by using the above-described holders, separate holders are needed according to each of the mounted components. For that reason, it is very complicated to take charge of and control the respective holders according to the mounted components in the mounting work and it is difficult to decrease the cost thereof.

SUMMARY OF THE INVENTION

It is therefore an object of the present invention to provide for the various mounted components a mounting device, which enables one to easily take charge of or control the holder, and which can reduce the cost of mounting components.

In order to attain the above-noted and other objects, a mounting device according to the present invention, wherein at least two holders are used for mounting electronic components onto a printed circuit board, each one of the holders comprises: a holder body; a first frame member extending from one end of an interconnecting piece at a right angle with the interconnecting piece; a second frame member extending from the other end of the interconnecting piece parallel to the first frame member; holding means for holding the electronic component, provided on the first and second frame members at a distance corresponding to a thickness of the electronic component; and engaging means for engaging the holder with the printed circuit board.

BRIEF DESCRIPTION OF THE DRAWINGS

In the accompanying drawings:

FIG. 2 (B) is a cross sectional view of the device shown in FIG. 2 (A);

FIG. 3 is a perspective view showing a mounting device for an electronic component or the like according to an embodiment of the present invention;

FIG. 4 is a perspective view showing a mounting device according to another embodiment of the present invention;

FIG. 5 is a cross sectional view of FIG. 6 showing a mounting device according to yet another embodiment of the present invention in a state that the device is mounted on a printed circuit board; and FIG. 6 is a perspective view showing the mounting device shown in FIG. 5.

DETAILED DESCRIPTION OF THE PREFERRED EMBODIMENTS

Figure 1:
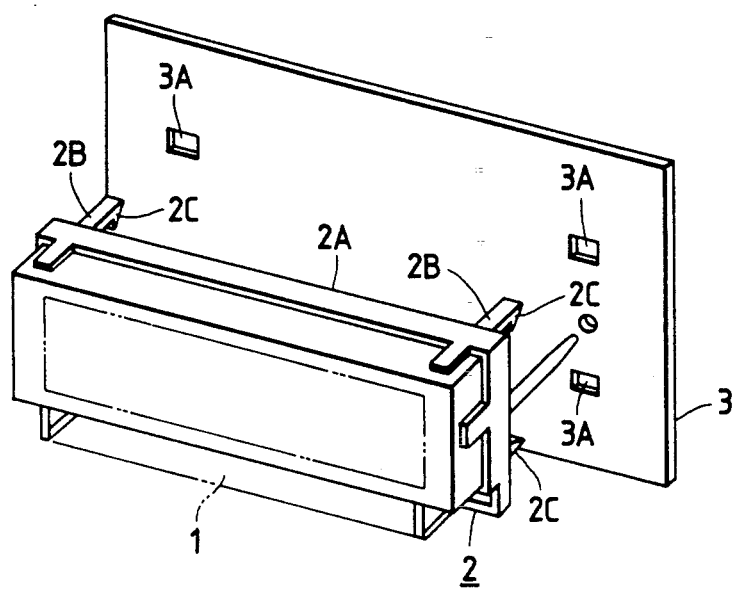
FIG. 1 is a perspective view showing a conventional mounting device.
Figure 2B:
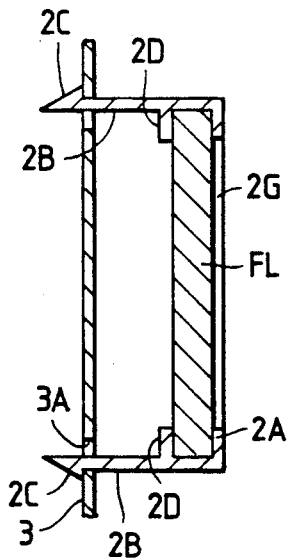
FIG. 2 (A) is a perspective view showing another conventional mounting device.
Figure 2A:
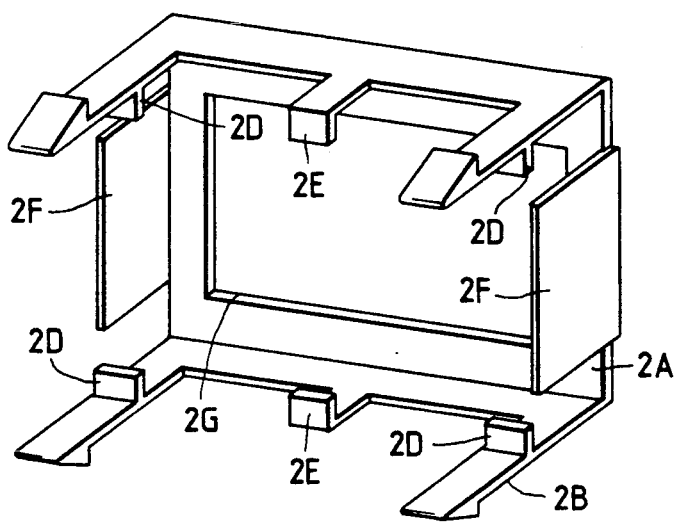

A mounting device according to an embodiment of the present is hereinafter described in detail with reference to the accompanying drawings.

FIG. 3 shows a mounting device according to an embodiment of the present invention. In FIG. 3, the numeral reference 10 designates a printed circuit board. The printed circuit board 10 is provided with a plurality of insertion holes 11 in a portion where a fluorescent luminescence display, hereinafter referred to as FL 20, is mounted thereon, so as to engage holders, described latter, with the insertion holes 11.

The FL 20 is supported at proximities of both ends thereof to holders 30 ( only one of which is illustrated ) and fixed to the printed circuit board 10 through the holders 30. The holders 30 are made of elastic materials, i.e., plastic materials. Each one of the holders 30 is provided with a holder body including interconnecting piece 31 having holding pieces 32 and 33 at its upper and lower ends respectively. The upper holding piece 32 is provided with a first mounting leg 34 extending perpendicularly thereto. The lower holding piece 33 is provided with a second mounting leg 35 extending parallel to the first mounting leg 34. Since the first and second mounting legs 34 and 35 are made of elastic materials, the legs are arranged to reduce the distance therebetween. The first and second legs 34 and 35 are provided with engaging claws 34A and 35A at distal ends thereof, respectively.

The first mounting leg 34 is provided with another engaging claw 34C in the form of a rib along the outer portion thereof. The engaging claws 34A and 34C are provided at a predetermined distance from each other corresponding to the thickness of the printed circuit board 10, to thereby define a step portion 34E. A step portion 35C is also defined in the second mounting leg 35 in the same arrangement as the first mounting leg 34.

Holding claws 32A and 33A are projected from the inner surfaces of the holding pieces 32 and 33, respectively, to hold the FL 20. The FL 20 is elastically supported in a space defined by the holder body and holding claws 32A and 33A.

A manner for mounting the FL 20 on the printed circuit board 10 by using the above-described holders 30, is hereinafter described.

The FL 20 is inserted into two holders 30 and is held at each end by a single holder 30. The FL 20 is supported in the space defined by the holder body and the holding claws 32A and 33A. In each one of holders 30, the distance of the engaging legs 34 and 35 is elastically reduced, so that the engaging claws 34A and 35A are inserted into the insertion hole 11 to thereby engage the step portions 34E and 35C with the top of the printed circuit board 10 adjacent insertion hole 11. After that, connectors 21 are fixedly soldered onto the pattern of the printed circuit board 10.

FIG. 4 shows a holder 30 according to another embodiment of the present invention. The holder 30 is provided at both ends of a interconnecting piece 31 with holding members 39 and hooks 36 and 37 in a corresponding distance from the interconnecting piece 31 to the thickness of the FL 20. The hooks 36 and 37 function as holding pieces 32 and 33 of the holder 30 shown in FIG. 3. A holding claw 38 is in the form of a rib and is provided along the outer surface of the interconnecting piece 31. The rib 38 and the holding member 39 are provided with engaging legs 38B and 37B and engaging claws 38A and 37A respectively. Step portions of the engaging claws 37A and 38A may be arranged outwardly the same as the engaging claws 34A and 35A of the holder 30. Also, only one of engaging claws 37A and 38A may be provided with a step portion.

In these embodiments described above, a display surface of the FL 20 is disposed perpendicular to the printed circuit board 10. However, it may be possible to dispose the display surface parallel to the printed circuit board 10, as shown in FIG. 5. FIG. 6 shows a holder according to yet another embodiment of the present invention, by which the FL 20 is supported such that the display surface of the FL 20 is disposed parallel to the printed circuit board.

As shown in FIG. 5, a holder is provided with an interconnecting piece 31. The interconnecting piece 31 is provided at both ends thereof with holding members 40 39 each having an engaging claw 39A at a distal end of the holding member 39 and an engaging claw 39B along the holding member 39. The reference 39B is in the form of a rib. The ends of the engaging claw 39A rib and 39B are facing each other at a distance to hold the printed circuit board therebetween. The holding member 39 is provided with a projection 39C projecting inwardly at a distance between the interconnecting piece and the projection 39C. The distance corresponds to the thickness of the FL 20 to hold the FL 20 between the interconnecting piece and the projection 39C in a state that the display surface of the FL 20 is arranged parallel to the standing printed circuit board 10 as shown in FIG. 5.

As apparent from the above disclosure, according to the mounting device of the present invention, since the holder is used independently of the width of the component, i.e., the FL to be mounted on the printed circuit board, the holder is adapted for the various components. Therefore, it is easy to take charge of the holders and to perform the mounting work of the component on the printed circuit board.

What is claimed is:

1. A mounting device for mounting an electronic component on a printed circuit board having at least one insertion hole; said mounting device comprising at least two non-connected holders made of elastic materials, each of said holders comprising:

a holder body which includes;
an upper holding piece, said upper holding piece having a first mounting leg extending perpendicularly thereto from a distal end thereof;
a lower holding piece, said lower holding piece having a second mounting leg extending parallel to said first mounting leg;
an interconnecting piece for interconnecting said upper and lower pieces at distal ends of each of said upper and lower pieces to form a U-shaped portion of said holder body;
each of said first and second mounting leg having an engaging claw at a distal end thereof, said engaging claw projecting outwardly; and
each of said upper and lower holding pieces having a holding claw at an inner side and at a distance from said interconnecting piece corresponding to the thickness of said electronic component for holding said electronic component between said holding claw and said interconnecting piece.

2. A mounting device for mounting an electronic component onto a printed circuit board having at least one insertion hole; said mounting device comprising at least two non-connected holders made of elastic materials, each of said holders comprising:

an interconnecting piece;
a first frame holding member extending from one end of said interconnecting piece at a right angle with said interconnecting piece;
a second frame holding member extending from the other end of said interconnecting piece parallel to said first frame holding member;
a holding means on said first and second frame holding members provide at distances from said interconnecting piece and corresponding to a thickness of said electronic component for holding an end of said electronic component between said holding means and said interconnecting piece;
an engaging means for engaging said holder with said printed circuit board;
said holding means includes:
a first projection being provided on an inner surface of said first frame holding member at said distance;
a second projection being provided on an inner surface of said second frame holding member at said distance;
said engaging means includes;
a first engaging leg extending from a distal end of said first frame holding member at a angle thereto;
a second engaging leg provided on an outer surface of said second frame holding member and extending parallel to said first engaging leg, each of said first and second engaging legs having a step portion for engaging said holder with an insertion hole provided in said printed circuit board.

3. A mounting device for mounting an electronic component onto a printed circuit board having at least one insertion hole; said mounting device comprising at least two non-connected holders made of elastic materials, each of said holders comprising:

an interconnecting piece;
a first frame holding member extending from one end of said interconnecting piece at a right angle with said interconnecting piece;
a second frame holding member extending from the other end of said interconnecting piece parallel to said first frame holding member;

a holding means on said first and second frame holding members provide at distances from said interconnecting piece and corresponding to a thickness of said electronic component for holding an end of said electronic component between said holding means and said interconnecting piece;

an engaging means for engaging said holder with said printed circuit board;

said holding means includes:

a first projection being provided on an inner surface of said first frame holding member at said distance;

a second projection being provided on an inner surface of said second frame holding member at said distance;

said engaging means includes:

a first engaging leg provided on an outer surface of said interconnecting piece; and a second engaging leg provided on an outer surface of said second frame holding member and extending parallel to said first engaging leg, each of said first and second engaging legs having an engaging claw at a distal end thereof for engaging with an insertion hole provided in said printed circuit board.

* * * * *